(12) United States Patent
Hagleitner et al.

(10) Patent No.: US 8,994,182 B2
(45) Date of Patent: Mar. 31, 2015

(54) DIELECTRIC SOLDER BARRIER FOR SEMICONDUCTOR DEVICES

(71) Applicant: Cree, Inc., Durham, NC (US)

(72) Inventors: Helmut Hagleitner, Zebulon, NC (US); Fabian Radulescu, Chapel Hill, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/724,426

(22) Filed: Dec. 21, 2012

(65) Prior Publication Data

US 2014/0175664 A1    Jun. 26, 2014

(51) Int. Cl.
| | | |
|---|---|---|
| H01L 23/48 | (2006.01) | |
| H01L 23/538 | (2006.01) | |
| H01L 21/48 | (2006.01) | |

(52) U.S. Cl.
CPC .......... *H01L 23/5384* (2013.01); *H01L 21/486* (2013.01); *H01L 2924/0002* (2013.01)
USPC .... 257/774; 257/621; 257/698; 257/E23.011; 257/E23.174; 257/E23.597; 438/667; 438/700

(58) Field of Classification Search
CPC ............ H01L 23/481; H01L 23/49805; H01L 23/49827
USPC .......... 257/774, 621, 698, E23.011, E23.174, 257/E21.597; 438/667, 700
See application file for complete search history.

(56) References Cited

U.S. PATENT DOCUMENTS

| | | | |
|---|---|---|---|
| 5,767,447 A | 6/1998 | Dudderar et al. | |
| 6,370,034 B1 | 4/2002 | Busch | |
| 6,856,004 B2 | 2/2005 | Kiaei et al. | |
| 7,265,052 B2 | 9/2007 | Sinha | |
| 7,282,804 B2* | 10/2007 | Lee | ............................. 257/777 |
| 7,608,485 B2 | 10/2009 | Hong et al. | |
| 8,138,087 B2 | 3/2012 | Morel et al. | |
| 2009/0302478 A1* | 12/2009 | Pagaila et al. | ................. 257/774 |
| 2010/0109114 A1* | 5/2010 | Izumi | ............................ 257/434 |
| 2011/0042803 A1* | 2/2011 | Chu | ............................ 257/737 |
| 2012/0175764 A1 | 7/2012 | Behammer et al. | |
| 2012/0267773 A1 | 10/2012 | Ebefors et al. | |
| 2013/0115730 A1 | 5/2013 | El-Gamal et al. | |

(Continued)

OTHER PUBLICATIONS

Non-final Office Action for U.S. Appl. 13/834,196 mailed May 27, 2014, 9 pages.

(Continued)

*Primary Examiner* — Tu-Tu Ho
(74) *Attorney, Agent, or Firm* — Withrow & Terranova, P.L.L.C.

(57) ABSTRACT

The present disclosure relates to a dielectric solder barrier for a semiconductor die. In one embodiment, a semiconductor die includes a substrate, a semiconductor body on a first surface of the substrate, one or more first metallization layers on the semiconductor body opposite the substrate, a via that extends from a second surface of the substrate through the substrate and the semiconductor body to the one or more first metallization layers, and a second metallization layer on the second surface of the substrate and within the via. A portion of the second metallization layer within the via provides an electrical connection between the second metallization layer and the one or more first metallization layers. The semiconductor die further includes a dielectric solder barrier on the second metallization layer. Preferably, the dielectric solder barrier is on a surface of the portion of the second metallization layer within the via.

22 Claims, 16 Drawing Sheets

(56) References Cited

U.S. PATENT DOCUMENTS

| | | |
|---|---|---|
| 2013/0256841 A1 | 10/2013 | Mieczkowski et al. |
| 2013/0277845 A1 | 10/2013 | Chen et al. |
| 2014/0054597 A1 | 2/2014 | Ritenour et al. |

OTHER PUBLICATIONS

Notice of Allowance for U.S. Appl. No. 13/834,196, mailed Oct. 8, 2014, 9 pages.

* cited by examiner

DIELECTRIC SOLDER BARRIER FOR SEMICONDUCTOR DEVICES

FIELD OF THE DISCLOSURE

The present disclosure relates to a dielectric solder barrier for semiconductor devices.

BACKGROUND

In the manufacturing of semiconductor devices, vias are often used to interconnect back-side and front-side metallization layers. For instance, radio frequency and power devices (e.g., High Electron Mobility Transistors (HEMTs), Field Effect Transistors (FETs), Metal-Oxide-Semiconductor Field Effect Transistors (MOSFETs), or Schottky diodes) are fabricated on a semiconductor wafer that may include front-side metallization as well as back-side metallization. The front-side metallization and the back-side metallization are interconnected by vias that extend from the back-side metallization to the front-side metallization. For example, a HEMT may include front-side metallization for source and drain contacts of the HEMT as well as back-side metallization that is interconnected to the front-side metallization by corresponding vias. In this case, the back-side metallization is desired to carry large currents to and from the source and drain of the HEMT.

One issue that arises is that, after dicing of the semiconductor wafer, solder used to mechanically and electrically connect the resulting die to a mounting substrate (e.g., a laminate) during packaging of the die mixes with the back-side metallization. As a result of the mixing, metal (e.g., Tin) from the solder moves through the back-side metallization and can destroy the die. In particular, any solder (e.g., AuSn, AuMo, or the like) that breaches through the back-side and front-side barriers creates a path for the solder to migrate through and degrade the front-side Schottky contact. For example, if the back-side metallization is Gold and the solder is Gold-Tin, the Gold-Tin solder mixes with the Gold back-side metallization. The Tin from the Gold-Tin solder then moves through the Gold back-side metallization and degrades the front-side Schottky contact.

To help prevent the mixing of the solder and the back-side metallization, a thick layer (e.g., a 1 micron thick layer) of Titanium or similar metal is typically deposited over the back-side metallization. However, depositing this thick layer takes a significant amount of time. The wafer may be impacted by the heat to which it is exposed while depositing this thick layer (e.g., a bonded carrier/substrate interface may be impacted by the heat). In addition, a significant amount of stress is created by this metal deposition.

SUMMARY

There is a need for a solder barrier for back-side metallization of a semiconductor die.

The present disclosure relates to a dielectric solder barrier for a semiconductor die. In one embodiment, a semiconductor die includes a substrate, a semiconductor body on a first surface of the substrate, one or more first metallization layers on the semiconductor body opposite the substrate, a via that extends from a second surface of the substrate through the substrate and the semiconductor body to the one or more first metallization layers, and a second metallization layer on the second surface of the substrate and within the via. A portion of the second metallization layer within the via provides an electrical connection between the second metallization layer and the one or more first metallization layers. The semiconductor die further includes a dielectric solder barrier on the second metallization layer.

In one preferred embodiment, the dielectric solder barrier is on a surface of the portion of the second metallization layer within the via. In one preferred embodiment, the dielectric solder barrier is within the via and extends laterally on the surface of the second metallization layer around a periphery of the via. When the semiconductor die is attached to a mounting substrate during package assembly, the dielectric solder barrier prevents solder from coming into contact with the second metallization layer within the via, which in turn increases a lifetime of one or more semiconductor devices fabricated on the semiconductor die.

In one embodiment, the dielectric solder barrier includes one or more dielectric layers formed using Plasma Enhanced Chemical Vapor Deposition (PECVD) and/or Atomic Layer Deposition (ALD).

In another embodiment, the dielectric solder barrier includes one or more oxide layers. In one particular embodiment, the one or more oxide layers are formed using PECVD and/or ALD.

In another embodiment, the dielectric solder barrier includes one or more layers of Aluminum Oxide ($Al_2O_3$), Silicon Dioxide ($SiO_2$), Silicon Nitride (SiN), Hafnium Oxide ($HfO_2$), and/or Titanium Oxide ($TiO_2$). In one embodiment, the one or more layers of the dielectric solder barrier are formed using PECVD and/or ALD.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
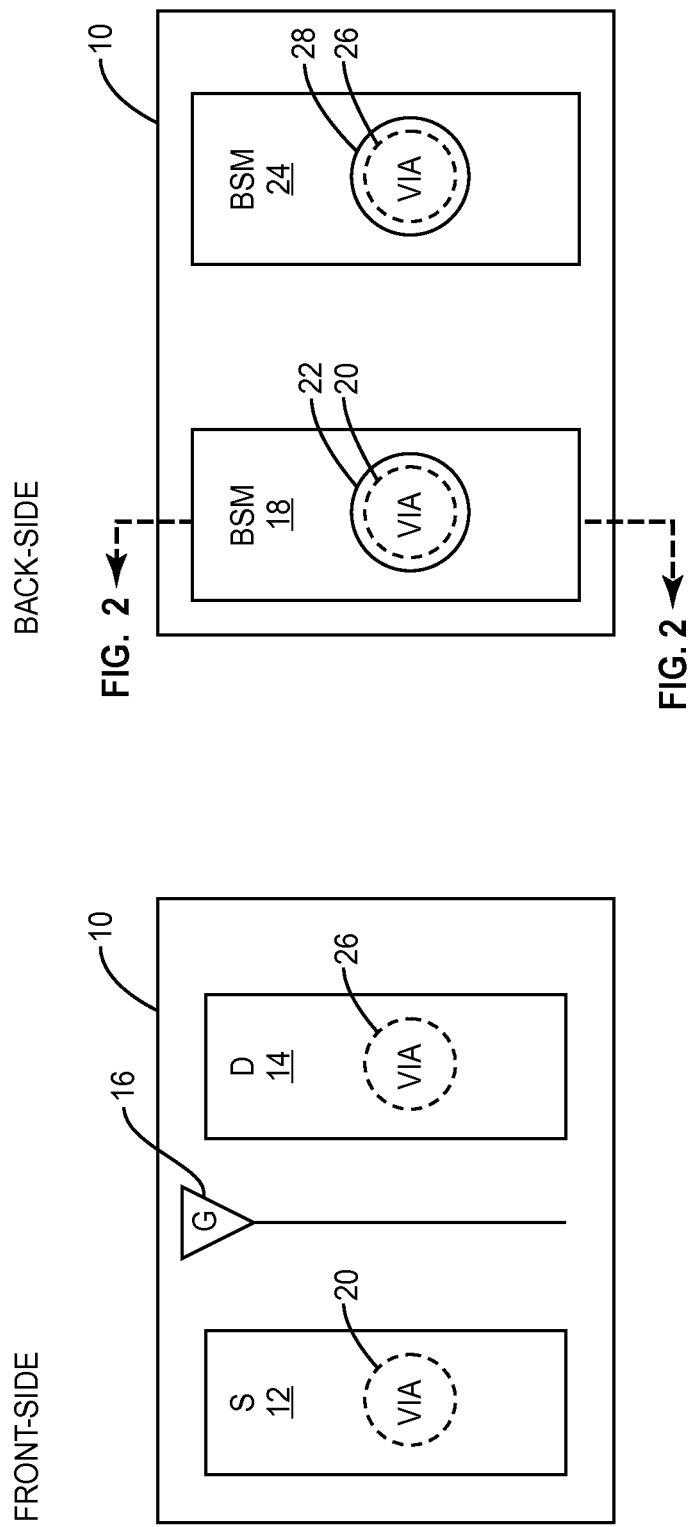
FIGS. 1A and 1B illustrate a front view and a back view of a semiconductor die that includes a dielectric solder barrier according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "front-side" or "back-side" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a dielectric solder barrier for a semiconductor die. In this regard, FIGS. 1A and 1B illustrate a front-side and a back-side view of a semiconductor die 10 according to one embodiment of the present disclosure. The semiconductor die 10 includes one or more semiconductor devices. In this particular embodiment, the semiconductor die 10 includes a lateral transistor having a source, drain, and gate region within the semiconductor die. The lateral transistor may be any type of lateral transistor such as, for example, a Field Effect Transistor (FET). It should be noted that the lateral transistor is only an example. The semiconductor device(s) implemented on the semiconductor die 10 may be any type of semiconductor device having both front-side and back-side metallization. In one particular embodiment, the semiconductor device(s) implemented on the semiconductor die 10 is a power device such as, for example, a power Metal-Oxide-Semiconductor Field Effect Transistor (MOSFET) (e.g., the Z-FET™ Silicon Carbide (SiC) MOSFET manufactured and sold by Cree, Inc. of 4600 Silicon Drive, Durham, N.C.) or a Schottky diode (e.g., the Z-Rec™ SiC Schottky diode manufactured and sold by Cree, Inc. of 4600 Silicon Drive, Durham, N.C.). In another particular embodiment, the semiconductor device(s) implemented on the semiconductor die 10 is a radio frequency device such as, for example, a High Electron Mobility Transistor (HEMT) (e.g., a SiC/Gallium Nitride (GaN) HEMT manufactured and sold by Cree, Inc. of 4600 Silicon Drive, Durham, N.C.).

As illustrated in FIGS. 1A and 1B, in this example, the semiconductor die 10 includes a source contact 12, a drain contact 14, and a gate contact 16 for a semiconductor device. The source contact 12 and the drain contact 14 are more generally referred to herein as front-side metallization layers. Notably, the source contact 12 and the drain contact 14 are formed over corresponding source and drain regions in a semiconductor body of the semiconductor die 10. The source contact 12 is electrically connected to a corresponding back-side metallization (BSM) 18 by a via 20. As discussed below in detail, a dielectric solder barrier 22 is provided on the back-side metallization 18 within the via 20 and extending laterally from the via 20 on the back-side metallization 18 around a periphery of the via 20. Likewise, the drain contact 14 is electrically connected to a corresponding back-side metallization 24 by a via 26. As discussed below in detail, a dielectric solder barrier 28 is provided on the back-side metallization 24 within the via 26 and extends laterally from the via 26 on the back-side metallization 24 around a periphery of the via 26.

Figure 2:
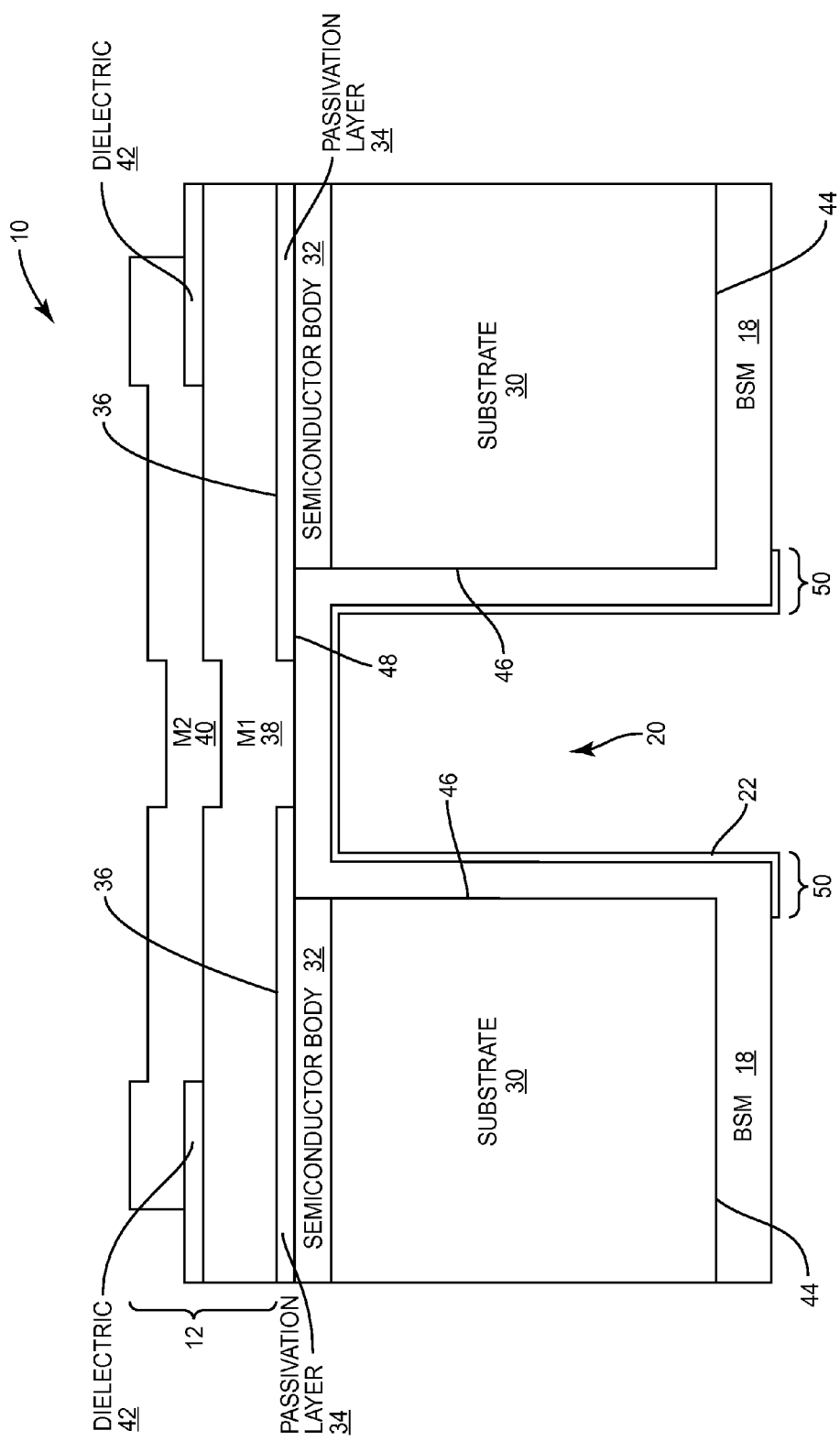
FIG. 2 is a cross-sectional view of the semiconductor die of FIG. 1 according to one embodiment of the present disclosure.

FIG. 2 is a cross-sectional view of the semiconductor die 10 of FIGS. 1A and 1B along the axis indicated in FIG. 1B according to one embodiment of the present disclosure. While this discussion focuses on the via 20 that interconnects the source contact 12 and the back-side metallization 18, this discussion is equally applicable to the via 26 that interconnects the drain contact 14 and the back-side metallization 24. As illustrated, the semiconductor die 10 includes a substrate 30 and a semiconductor body 32 on a surface of the substrate 30. The substrate 30 is preferably formed of SiC, but is not limited thereto. The substrate 30 may be formed of other materials such as, for example, Sapphire, Aluminum Nitride (AlN), Aluminum Gallium Nitride (AlGaN), GaN, Silicon (Si), Gallium Arsenide (GaAs), Zinc Oxide (ZnO), and Indium Phosphide (InP). The semiconductor body 32 preferably includes one or more epitaxial layers of one or more wide bandgap materials such as, for example, one or more Group III nitrides. For example, the semiconductor body 32 may be formed of one or more layers of GaN and/or AlGaN. However, other Group III nitride materials may be used. A passivation layer 34 is on the surface of the semiconductor body 32 opposite the substrate 30. As an example, the passivation layer 34 may be formed of one or more dielectric layers such as, but not limited to, one or more layers of Silicon Nitride (SiN).

The source contact 12 is formed on a front-side surface 36 of the semiconductor die 10. In this example, the source contact 12 includes metallization layers 38 and 40 on the front-side surface 36 of the semiconductor die 10, which in this example corresponds to the surface of the passivation layer 34 opposite the semiconductor body 32. In this example, portions of the metallization layers 38 and 40 are separated by a dielectric layer 42. Note that the source contact 12 of FIG. 2 is only an example. One of ordinary skill in the art will readily appreciate that details of the source contact 12 will vary depending on the particular implementation.

The via 20 extends from a back-side surface 44 of the semiconductor die 10, which in this example is a back-side surface of the substrate 30, through the substrate 30 and the semiconductor body 32 to the metallization layer 38 of the source contact 12. The back-side metallization 18 is on the back-side surface 44 of the semiconductor die 10. In addition, the back-side metallization 18 is within the via 20. More specifically, the portion of the back-side metallization 18 within the via 20 is on side-walls 46 of the via 20 as well as on a terminating end 48 of the via 20. The portion of the back-side metallization 18 within the via 20 provides an electrical connection between the back-side metallization 18 on the back-side surface 44 of the semiconductor die 10 and the source contact 12 (i.e., the front-side metallization of the semiconductor die 10).

The dielectric solder barrier 22 is on a surface of the back-side metallization 18 within the via 20 and extends laterally from the via 20 on the surface of the back-side metallization 18 on the back-side surface 44 of the semiconductor die 10. More specifically, the dielectric solder barrier 22 is on the surface of the back-side metallization 18 opposite the sidewalls 46 and the terminating end 48 of the via 20. In addition, the dielectric solder barrier 22 includes a portion 50 that extends laterally around a periphery of the via 20. Notably, the lateral extension of the dielectric solder barrier 22 is such that a significant portion of the back-side metallization 18 on the back-side of the semiconductor die 10 is exposed. The exposed portion of the back-side metallization 18 is electrically and mechanically connected to a mounting substrate by solder during packaging.

In general, the dielectric solder barrier 22 includes one or more dielectric layers. In one embodiment, the dielectric solder barrier 22 has a thickness in a range of and including 1000 to 5000 Angstroms. The dielectric solder barrier 22 is preferably formed by Plasma Enhanced Chemical Vapor Deposition (PECVD), Atomic Layer Deposition (ALD), and/or the like. In one embodiment, the dielectric solder barrier 22 includes one or more oxide layers.

In another embodiment, the dielectric solder barrier 22 includes one or more layers of Aluminum Oxide ($Al_2O_3$), Silicon Dioxide ($SiO_2$), SiN, Hafnium Oxide ($HfO_2$), or Titanium Oxide ($TiO_2$). In one preferred embodiment, the dielectric solder barrier 22 is, or includes, a layer of $SiO_2$ deposited using PECVD. In another preferred embodiment, the dielectric solder barrier 22 is, or includes, an $Al_2O_3$ layer and a $SiO_2$ layer on the $Al_2O_3$ layer, where the $Al_2O_3$ layer is formed using ALD and the $SiO_2$ layer is formed using PECVD or ALD. When soldering the back-side metallization 18 to a mounting substrate during assembly, the dielectric solder barrier 22 prevents the solder from coming into contact with the back-side metallization 18 within the via 20, which in turn increases the lifetime of the semiconductor device fabricated on the semiconductor die 10.

In one particular embodiment, the back-side metallization layer 18 is Gold (Au), and the solder used to solder the back-side metallization 18 to the mounting substrate is Gold-Tin (AuSn). In this embodiment, the dielectric solder barrier 22 is formed of one or more dielectric or oxide layers that are non-wetting with respect to Tin (Sn). For example, the dielectric solder barrier 22 may be one or more layers of $Al_2O_3$, $SiO_2$, SiN, $HfO_2$, or $TiO_2$. In one preferred embodiment, the dielectric solder barrier 22 is, or includes, a layer of $SiO_2$ deposited using PECVD. In another preferred embodiment, the dielectric solder barrier 22 is, or includes, an $Al_2O_3$ layer and a $SiO_2$ layer on the $Al_2O_3$ layer, where the $Al_2O_3$ layer is formed using ALD and the $SiO_2$ layer is formed using PECVD or ALD. By being non-wetting with respect to Sn, the dielectric solder barrier 22 prevents the Sn from mixing with the back-side metallization layer 18 within the via 20, which in turn prevents the Sn from destroying the semiconductor device.

Figure 3A:
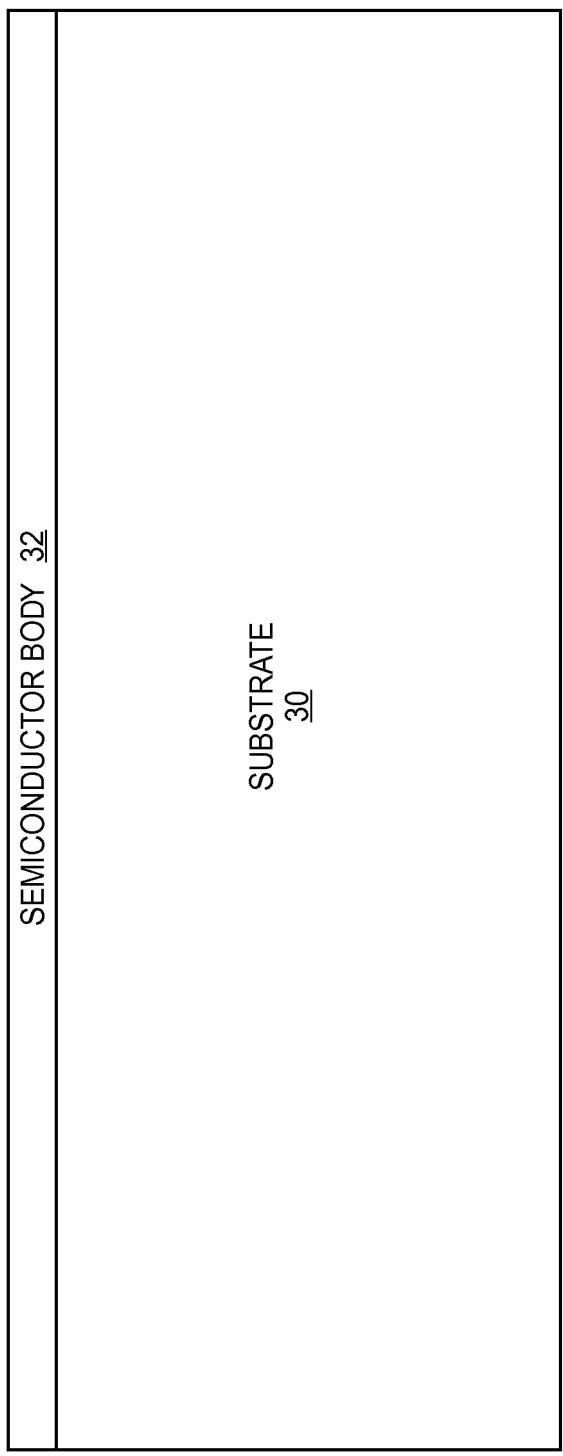
FIGS. 3A through 3N graphically illustrate a process for fabricating the semiconductor die according to one embodiment of the present disclosure.
Figure 3B:
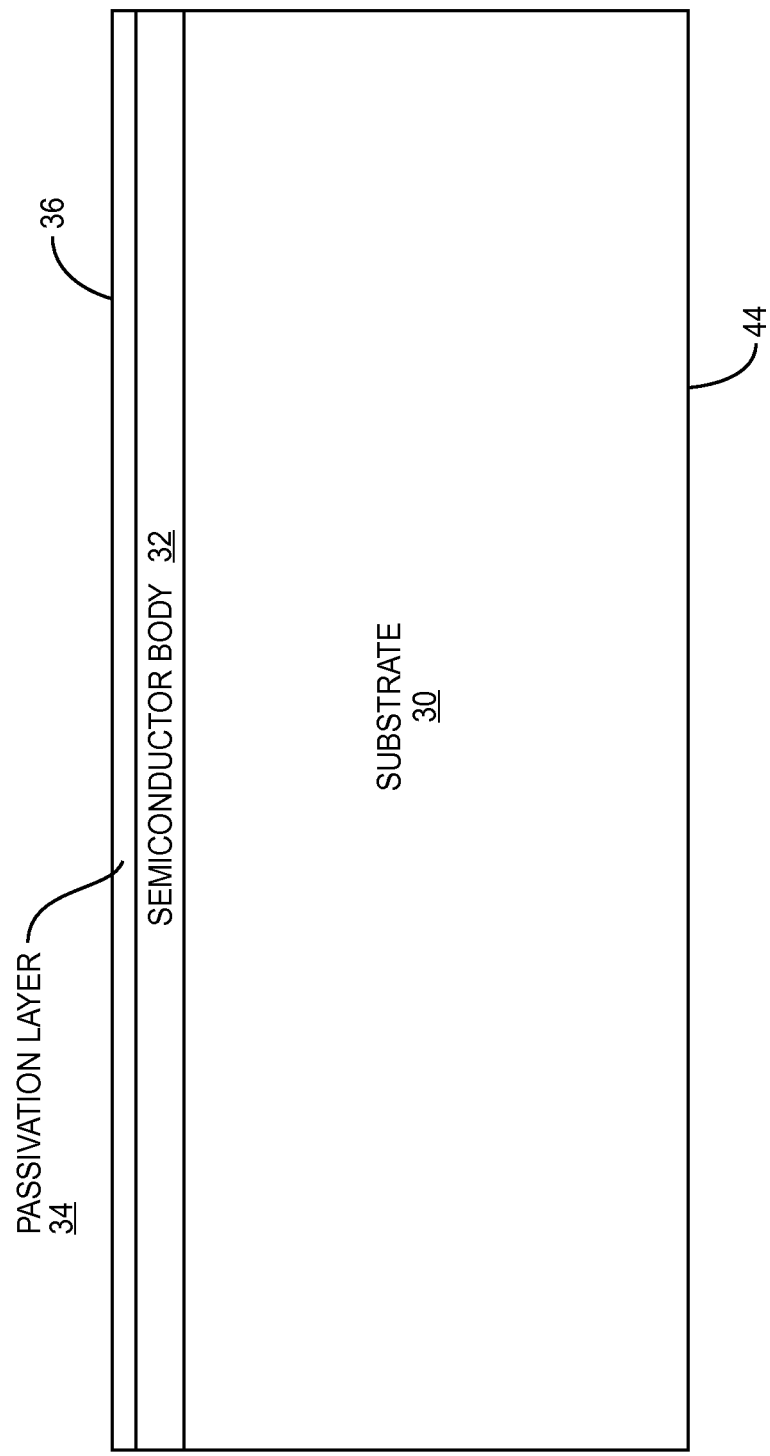
Figure 3C:
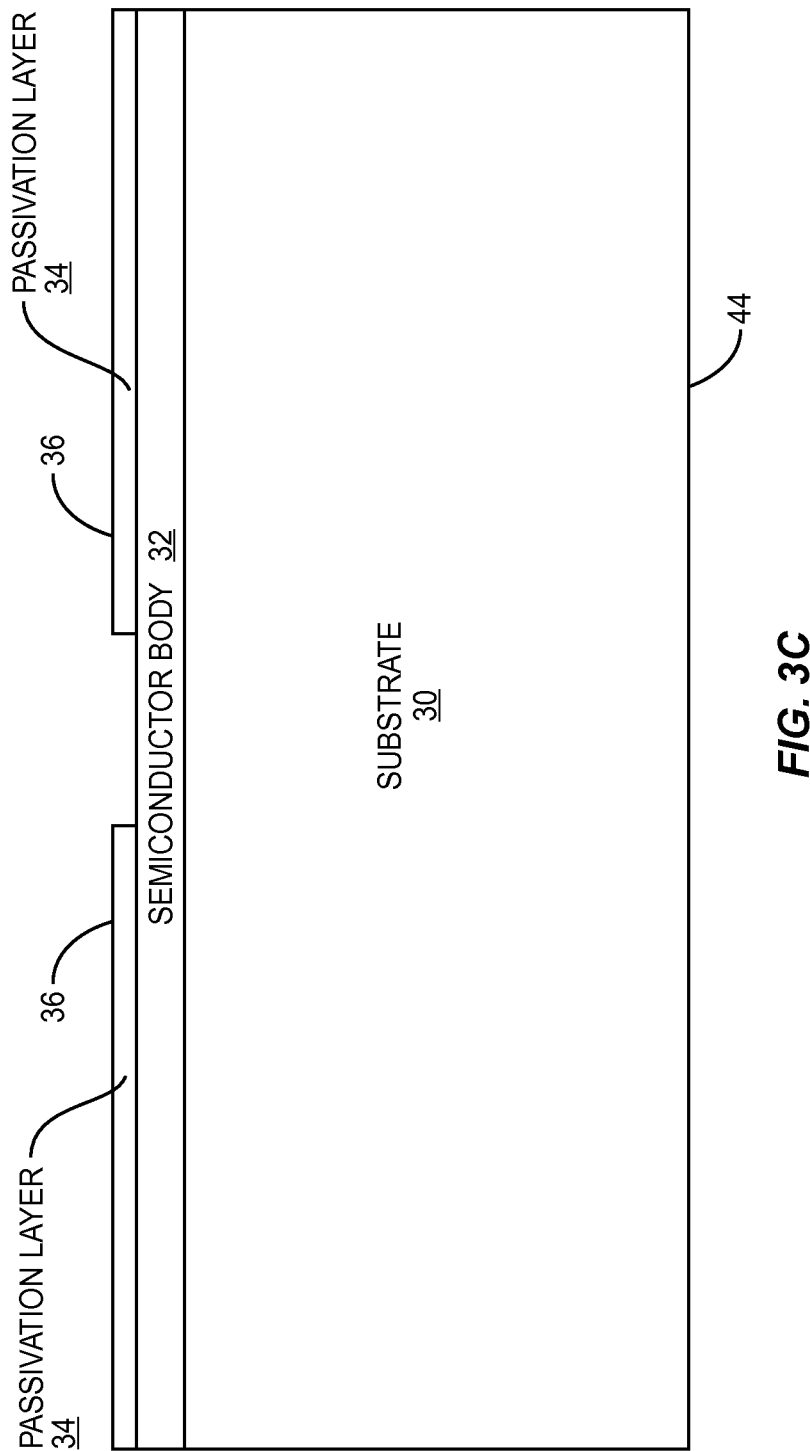
Figure 3D:
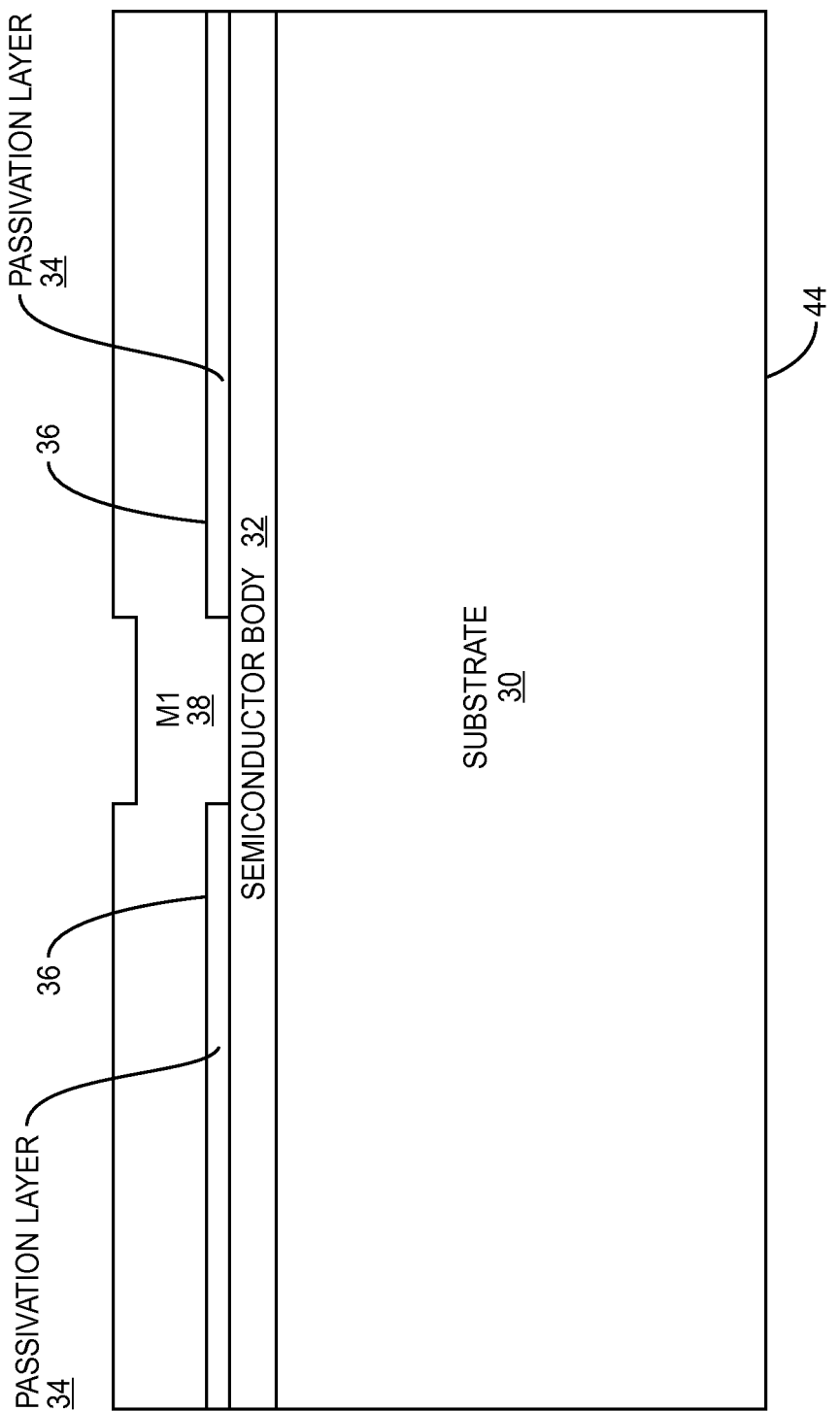
Figure 3E:
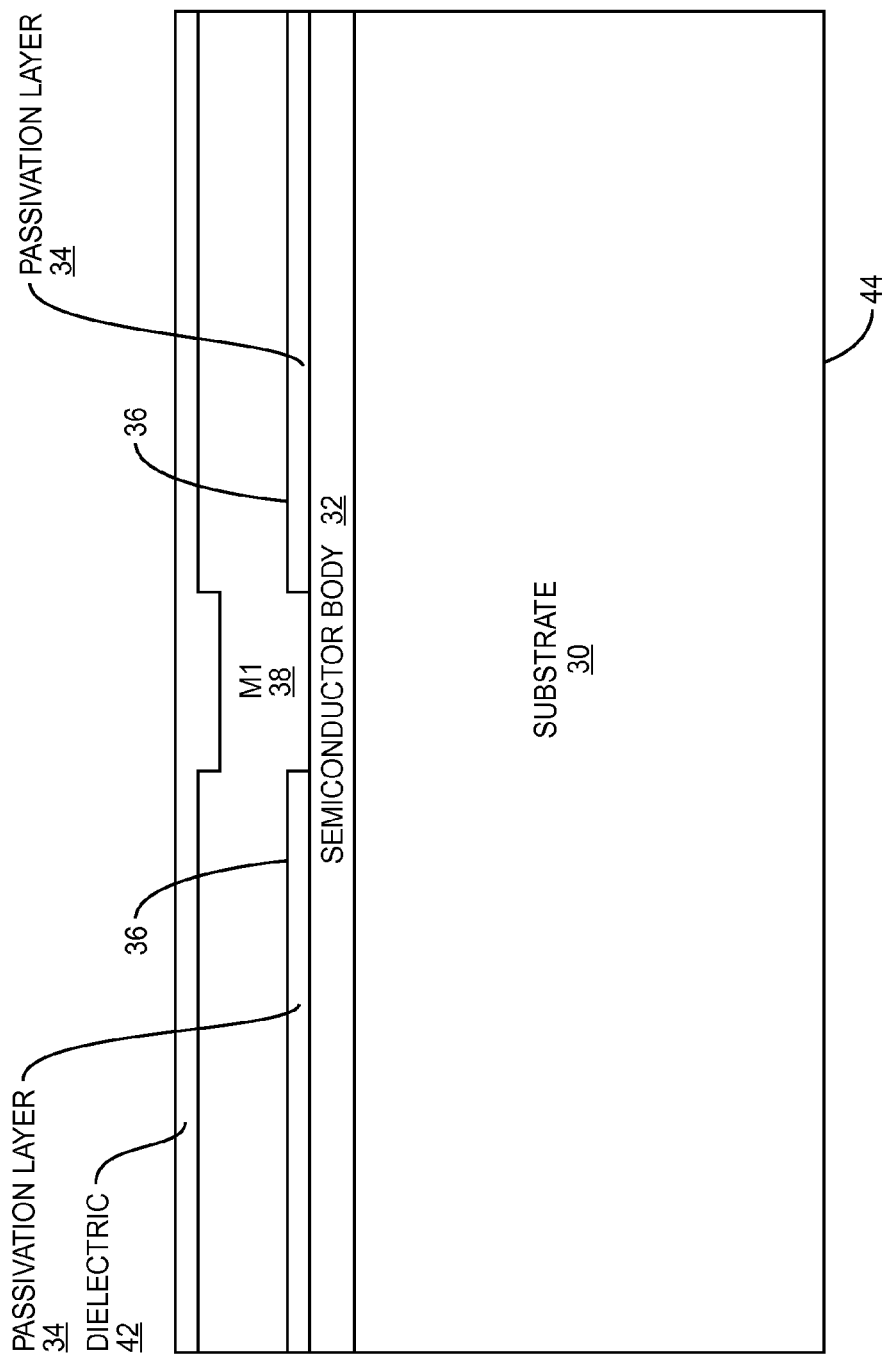
Figure 3F:
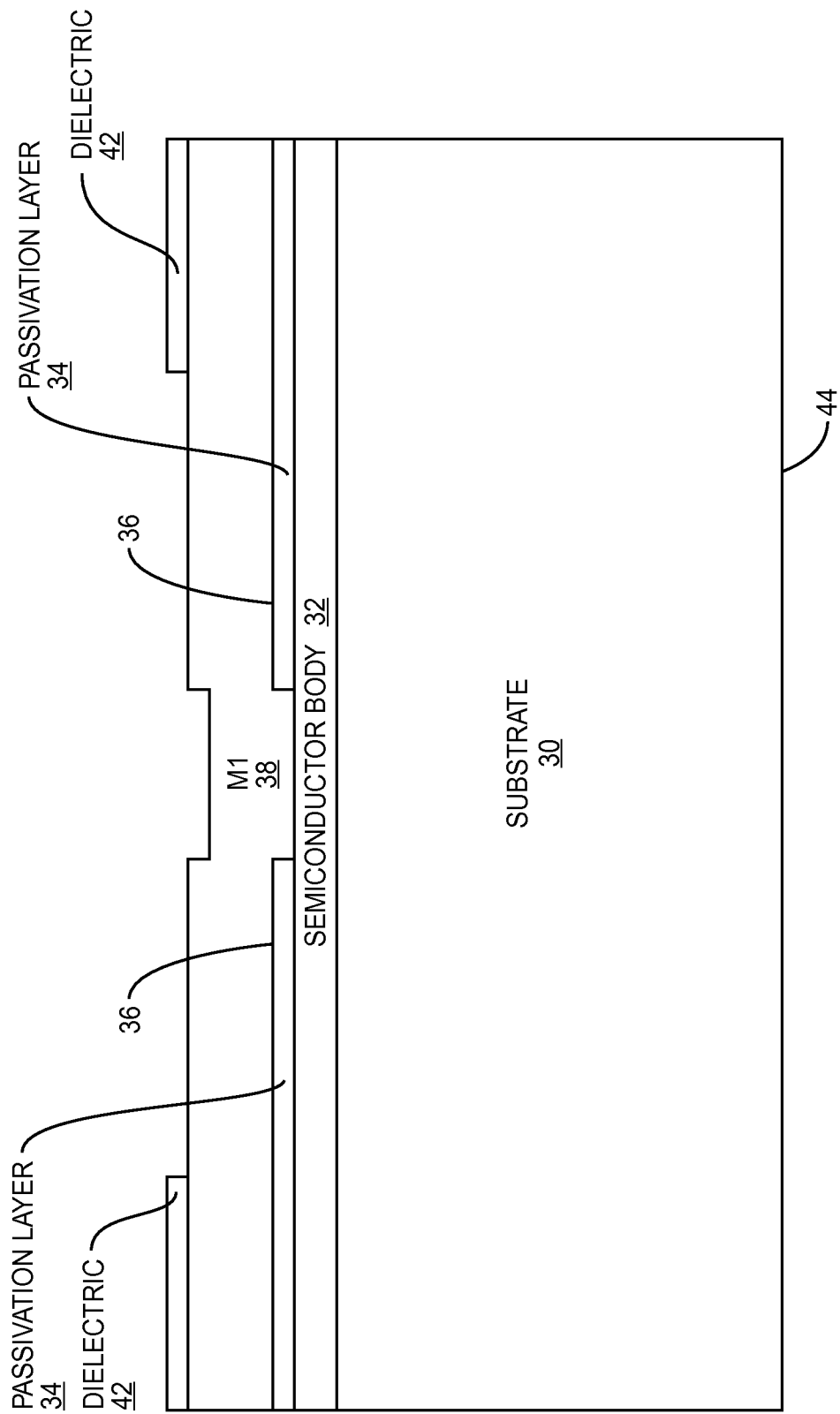
Figure 3G:
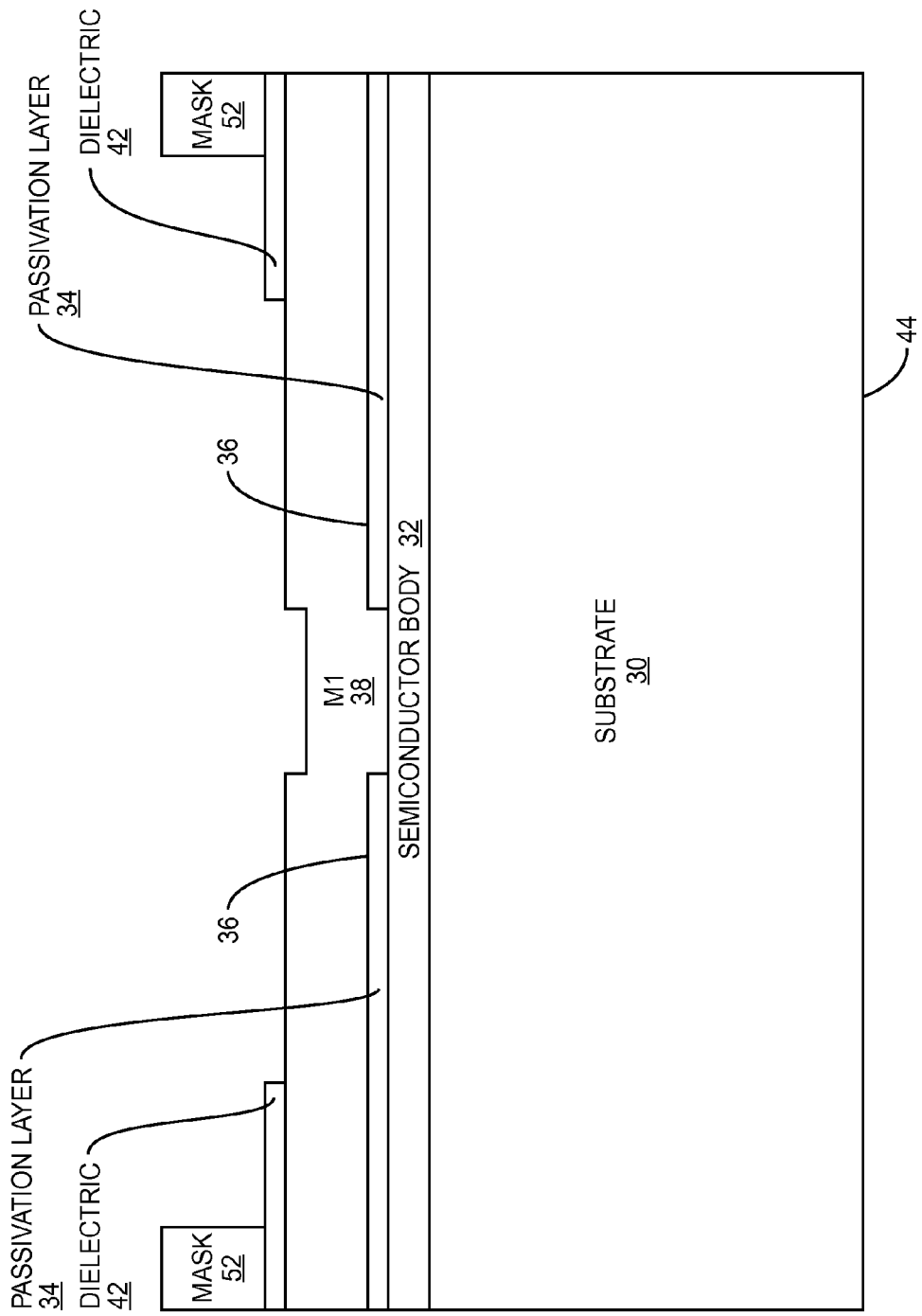
Figure 3H:
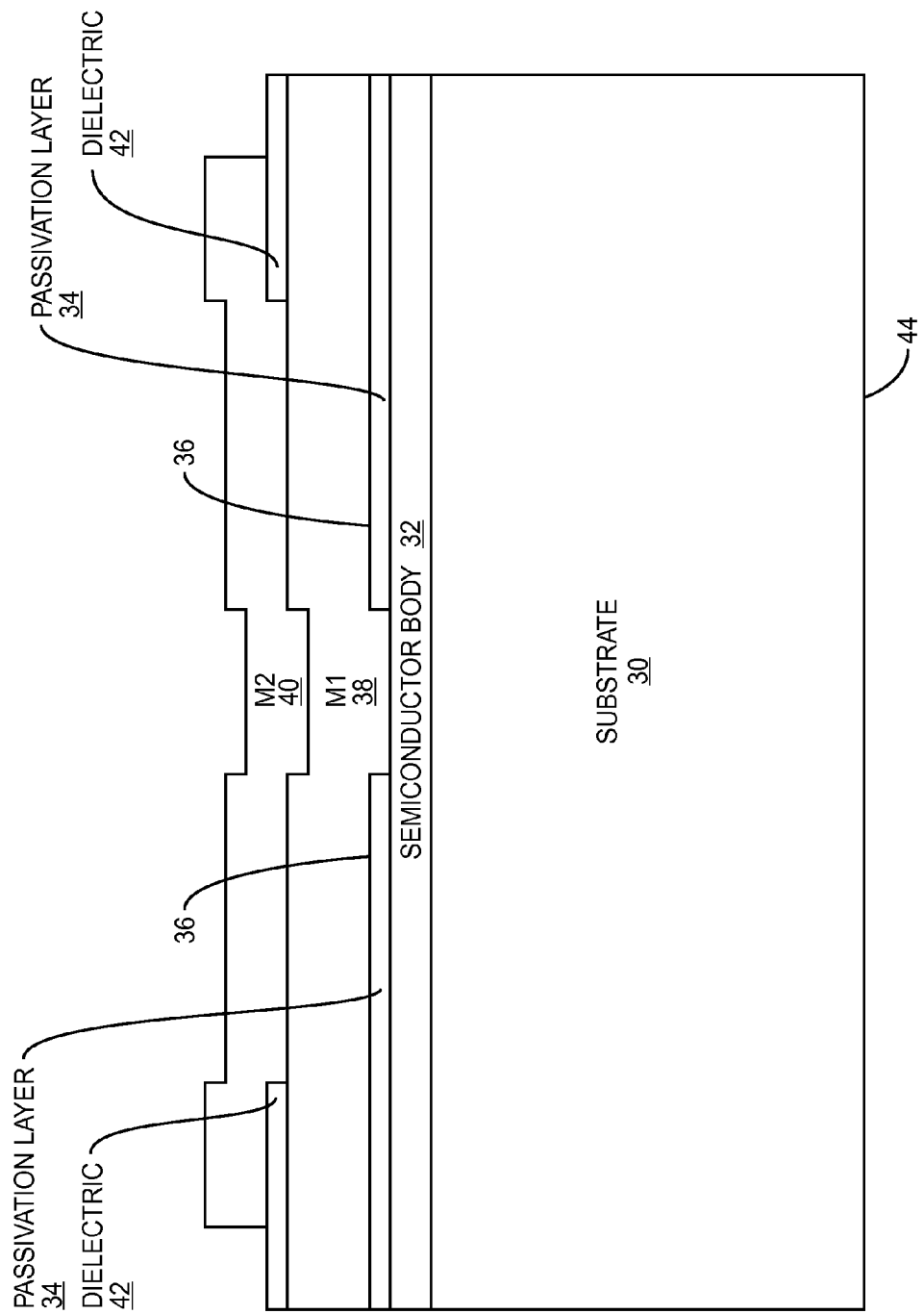
Figure 3I:
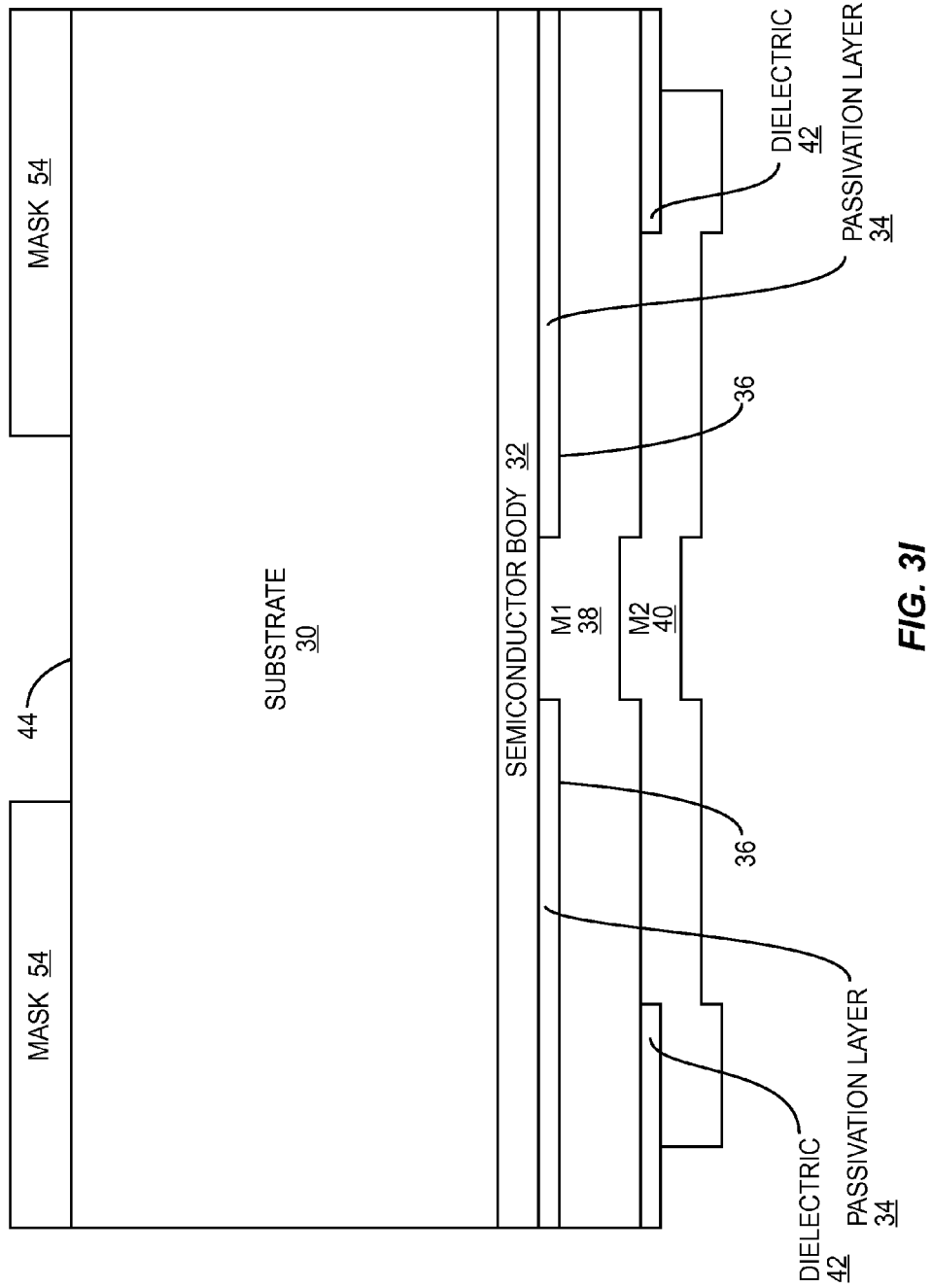
Figure 3J:
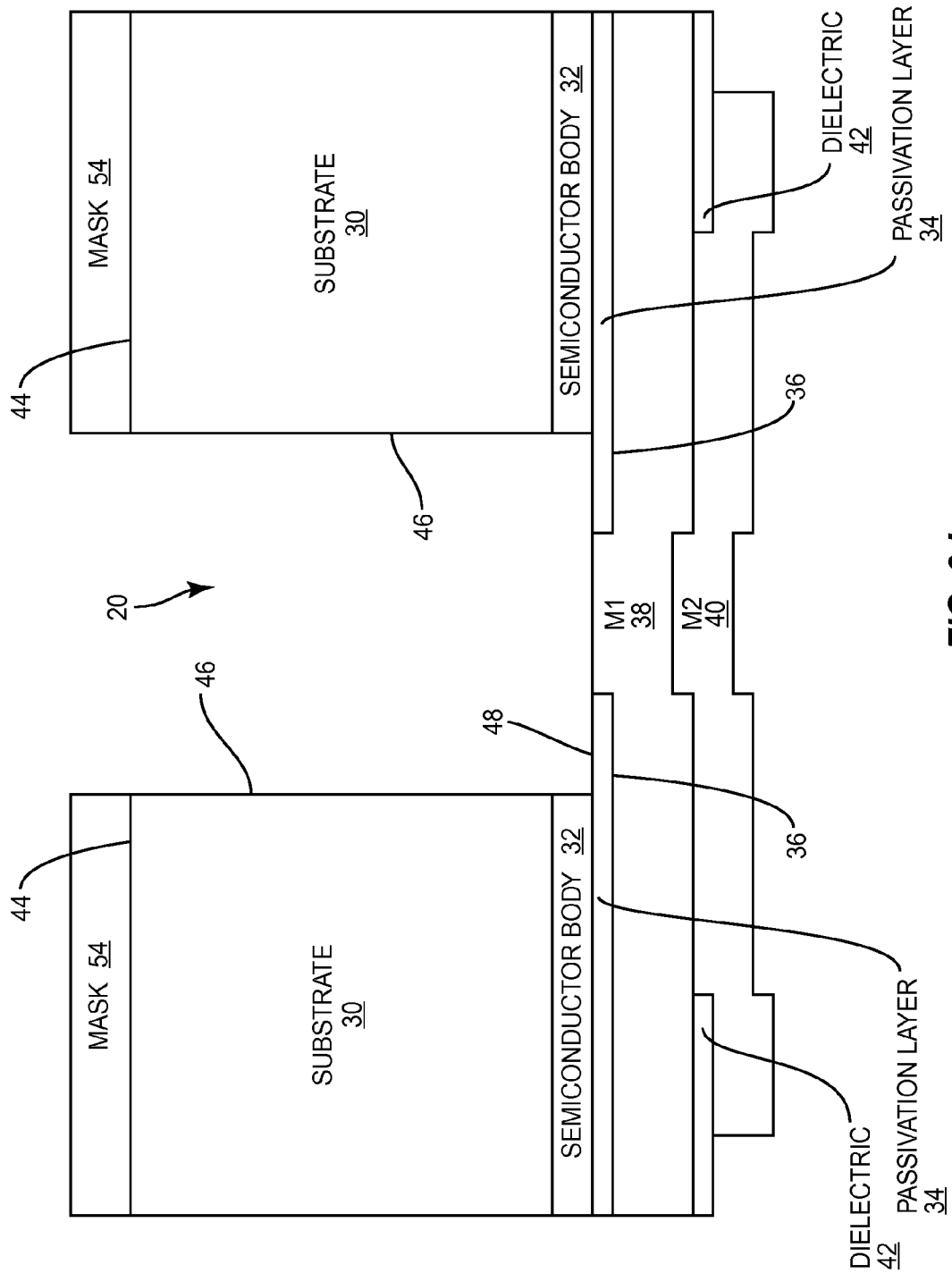
Figure 3K:
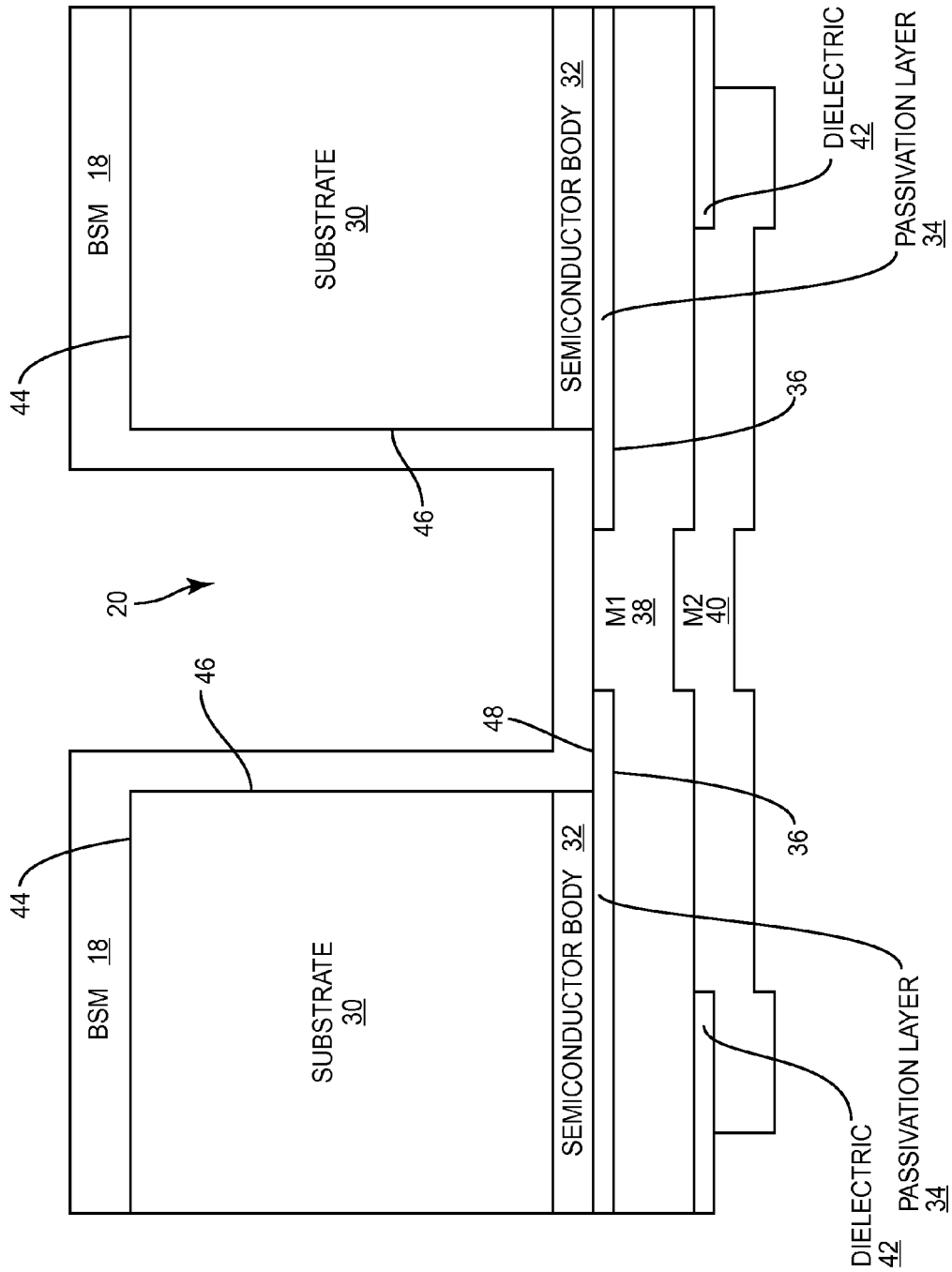
Figure 3L:
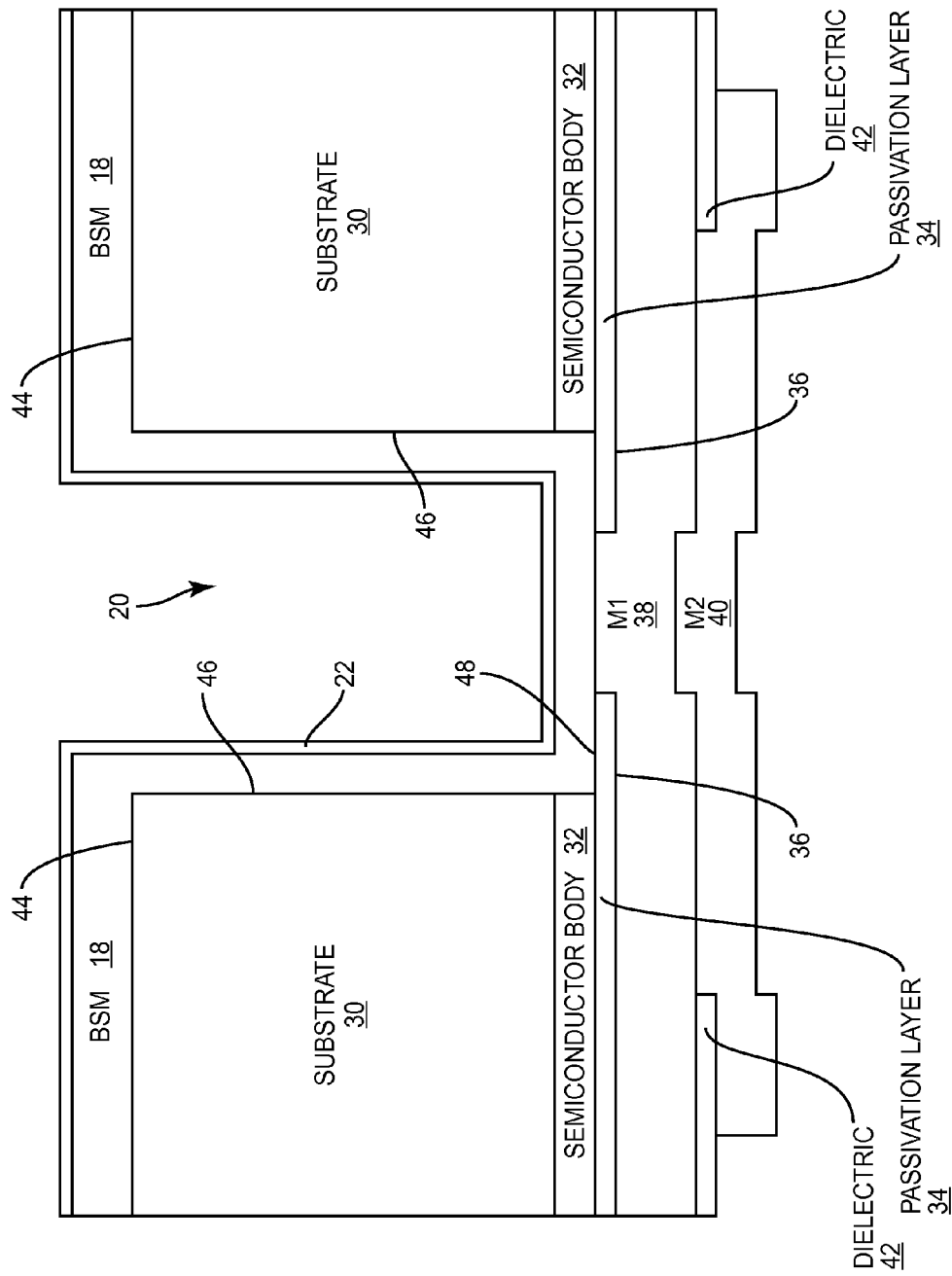
Figure 3M:
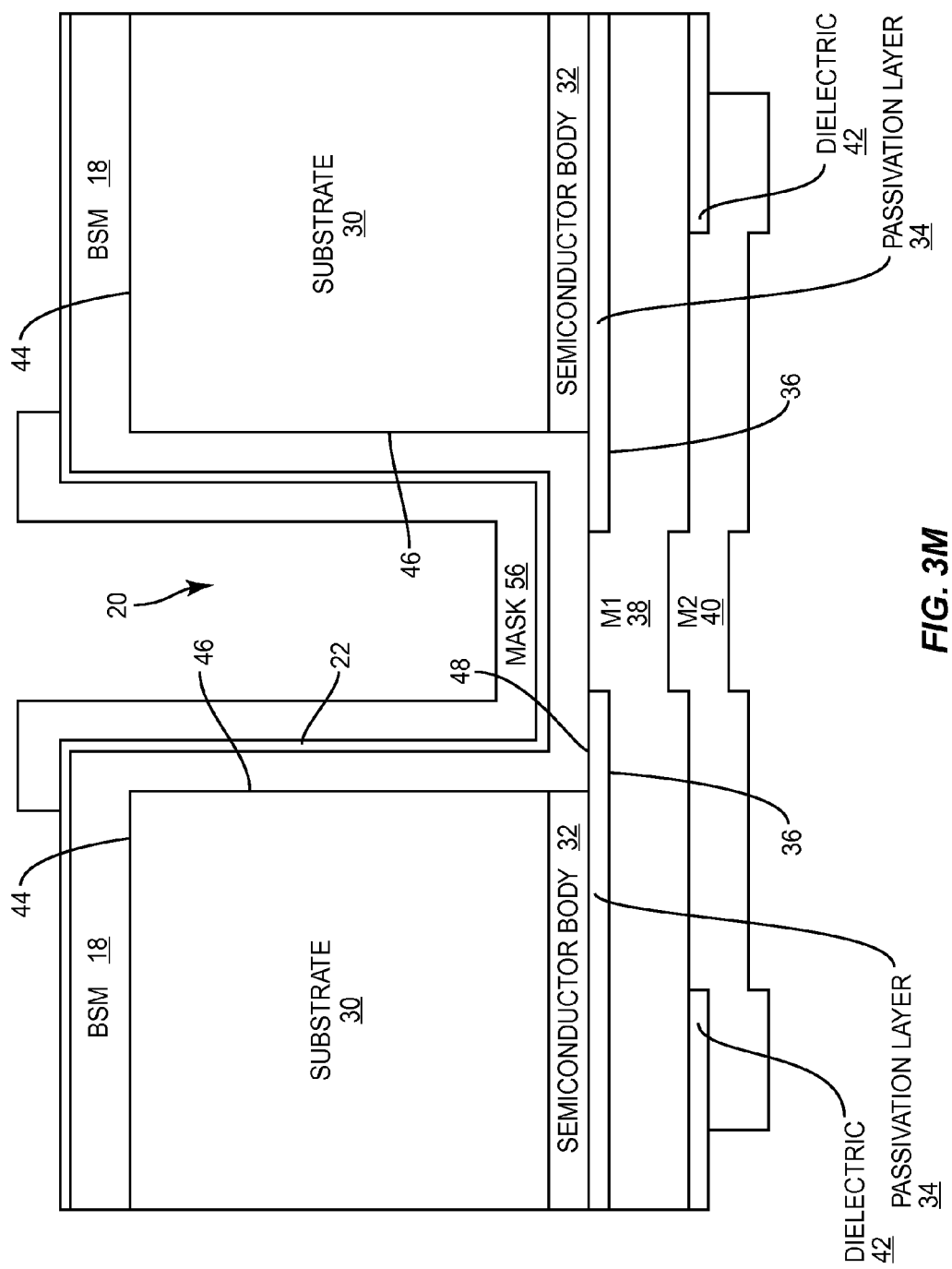
Figure 3N:
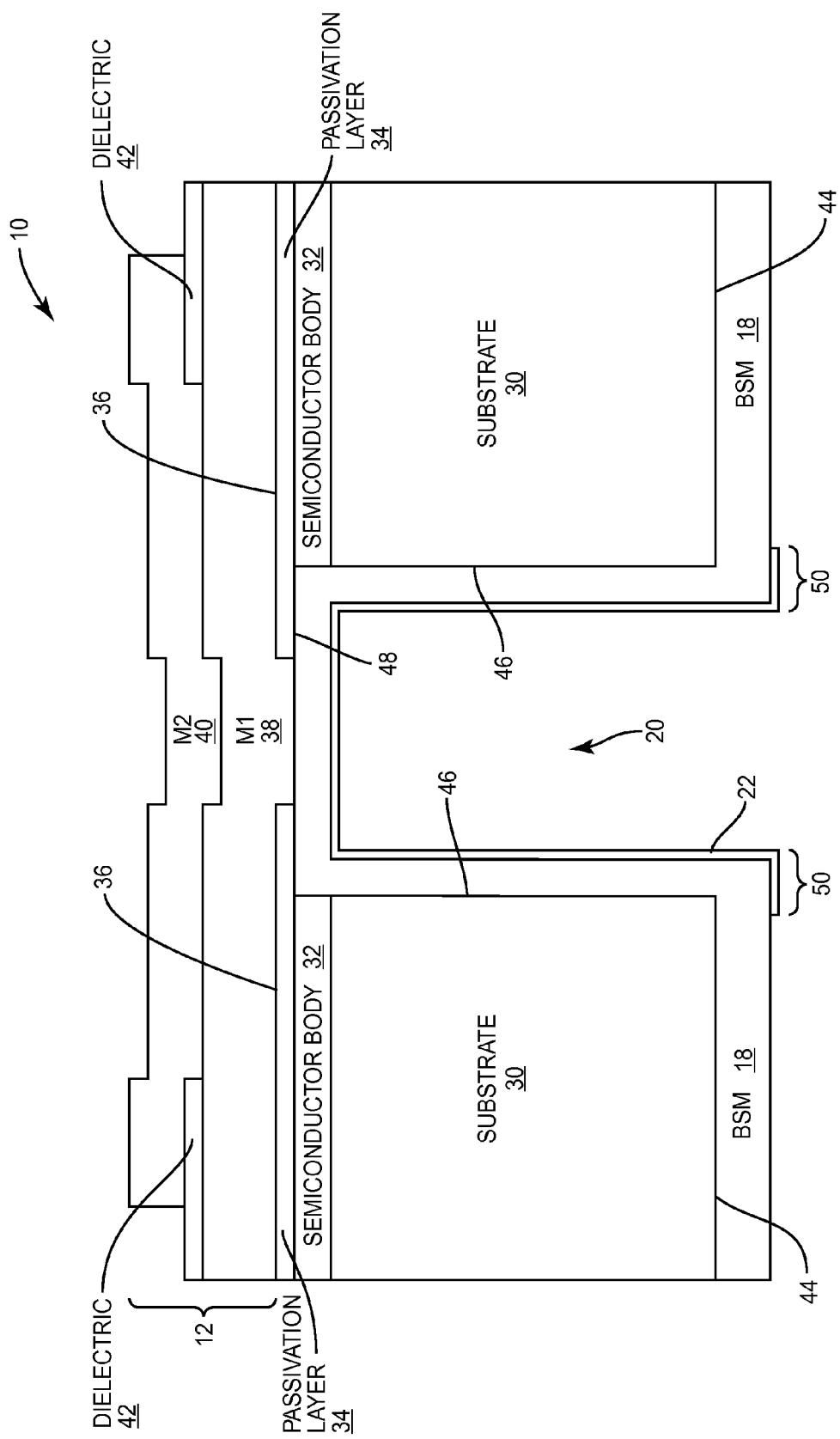

FIGS. 3A through 3N graphically illustrate a process for fabricating the semiconductor die 10 of FIG. 2 according to one embodiment of the present disclosure. The process begins with the substrate 30 and the semiconductor body 32 as illustrated in FIG. 3A. The passivation layer 34 is then formed on the surface of the semiconductor body 32 opposite the substrate 30 and etched to expose a portion of the surface of the semiconductor body 32, as illustrated in FIGS. 3B and 3C. In this example, the exposed portion of the surface of the semiconductor body 32 is a portion of the surface of the semiconductor body 32 over which the source contact 12 is to be formed. The metallization layer 38 is then formed on the surface of the passivation layer 34 and the exposed portion of the surface of the semiconductor body 32 as illustrated in FIG. 3D. Next, the dielectric layer 42 is formed on the surface of the metallization layer 38 and etched to expose a portion of the metallization layer 38, as illustrated in FIGS. 3E and 3F. Using a mask 52, the metallization layer 40 is then deposited on the surface of the dielectric layer 42 and the exposed portion of the metallization layer 38, as illustrated in FIGS. 3G and 3H. At this point, front-side metallization is complete.

In this example, after the front-side metallization is complete, the semiconductor die 10 is flipped. The substrate 30 and the semiconductor body 32 are then etched using a mask 54 to thereby form the via 20, as illustrated in FIGS. 3I and 3J. Next, the mask 54 is removed, and the back-side metallization 18 is deposited over the back-side surface 44 of the semiconductor die 10 and within the via 20, as illustrated in FIG. 3K. The dielectric solder barrier 22 is then deposited on the back-side metallization 18 as illustrated in FIG. 3L. As discussed above, the dielectric solder barrier 22 is preferably deposited using PECVD and/or ALD. Lastly, using a mask 56, the dielectric solder barrier 22 is etched to expose a portion of the surface of the back-side metallization 18 outside of the via 20, as illustrated in FIGS. 3M and 3N. After etching, the dielectric solder barrier 22 covers the back-side metallization 18 within the via 20 (i.e., the dielectric solder barrier 22 covers a portion of the back-side metallization 18 opposite the sidewalls 46 and terminating end 48 of the via 20) as well as a portion of the back-side metallization 18 on the back-side surface 44 of the semiconductor die 10 around a periphery of the via 20. The lateral extension of the dielectric solder barrier 22 around the periphery of the via 20 improves the solder barrier provided by the dielectric solder barrier 22.

Alternatively, rather than etching the dielectric solder barrier 22 as described above with respect to FIGS. 3M and 3N, a lift-off process may be used. More specifically, a mask may be provided on the portion of the back-side metallization 18 that is not to be covered by the dielectric solder barrier 22. The dielectric solder barrier 22 may then be deposited over the mask and the exposed surface of the back-side metallization 18 to thereby deposit the dielectric solder barrier 22 within the via 20 and around the periphery of the via 20. The mask is then removed, which also removes the undesired portion of the dielectric solder barrier 22 deposited on the mask.

Those skilled in the art will recognize improvements and modifications to the preferred embodiments of the present disclosure. All such improvements and modifications are considered within the scope of the concepts disclosed herein and the claims that follow.

What is claimed is:
1. A semiconductor die comprising:
   a substrate having a first surface and a second surface;
   a semiconductor body on the first surface of the substrate;
   one or more first metallization layers on the semiconductor body opposite the substrate;

a via that extends from the second surface of the substrate through the substrate and the semiconductor body to the one or more first metallization layers;

a second metallization layer on the second surface of the substrate and within the via such that a portion of the second metallization layer within the via provides an electrical connection between the second metallization layer and the one or more first metallization layers; and a dielectric solder barrier comprising one or more oxide layers on the second metallization layer.

2. The semiconductor die of claim 1 wherein the dielectric solder barrier is on a surface of the portion of the second metallization layer within the via.

3. The semiconductor die of claim 2 wherein the dielectric solder barrier is on the surface of the second metallization layer opposite side-walls and a terminating end of the via and extends laterally on the surface of the second metallization layer around a periphery of the via.

4. The semiconductor die of claim 3 wherein the dielectric solder barrier extends laterally on the surface of the second metallization layer around the periphery of the via such that the dielectric solder barrier is on only a portion of the second metallization layer opposite the second surface of the substrate.

5. The semiconductor die of claim 3 wherein the dielectric solder barrier prevents solder from coming into contact with the portion of the second metallization layer within the via when the semiconductor die is attached to a mounting substrate.

6. The semiconductor die of claim 3 wherein the dielectric solder barrier layer comprises at least one of a group consisting of: one or more Plasma Enhanced Chemical Vapor Deposited dielectric layers and one or more Atomic Layer Deposited dielectric layers.

7. The semiconductor die of claim 3 wherein the dielectric solder barrier is non-wetting with respect to Tin.

8. The semiconductor die of claim 1 wherein the one or more oxide layers comprise at least one of a group consisting of: one or more Plasma Enhanced Chemical Vapor Deposited oxide layers and one or more Atomic Layer Deposited oxide layers.

9. The semiconductor die of claim 3 wherein the dielectric solder barrier comprises a Silicon Dioxide layer.

10. The semiconductor die of claim 9 wherein the Silicon Dioxide layer is a Plasma Enhanced Chemical Vapor Deposited Silicon Dioxide layer.

11. The semiconductor die of claim 3 wherein the dielectric solder barrier comprises an Aluminum Oxide layer.

12. The semiconductor die of claim 11 wherein the Aluminum Oxide layer is an Atomic Layer Deposited Aluminum Oxide layer, and the dielectric solder barrier further comprises a Silicon Dioxide layer on a surface of the Atomic Layer Deposited Aluminum Oxide layer opposite the second metallization layer.

13. The semiconductor die of claim 12 wherein the Silicon Dioxide layer is a Plasma Enhanced Chemical Vapor Deposited Silicon Dioxide layer.

14. The semiconductor die of claim 3 wherein the dielectric solder barrier comprises one or more of a group consisting of: an Aluminum Oxide layer, a Silicon Dioxide layer, a Hafnium Oxide layer, and a Titanium Oxide layer.

15. A method comprising:

providing a semiconductor die comprising a substrate having a first surface and a second surface, a semiconductor body on the first surface of the substrate, one or more first metallization layers on the semiconductor body opposite the substrate, and a via that extends from the second surface of the substrate through the substrate and the semiconductor body to the one or more first metallization layers;

depositing a second metallization layer on the second surface of the substrate and within the via such that a portion of the second metallization layer within the via provides an electrical connection between the second metallization layer and the one or more first metallization layers; and forming a dielectric solder barrier comprising one or more oxide layers on the second metallization layer.

16. The method of claim 15 wherein forming the dielectric solder barrier layer comprises forming the dielectric solder barrier layer on a surface of the portion of the second metallization layer within the via.

17. The method of claim 16 wherein forming the dielectric solder barrier comprises forming the dielectric solder barrier such that the dielectric solder barrier is on the surface of the second metallization layer opposite side-walls and a terminating end of the via and extends laterally on the surface of the second metallization layer around a periphery of the via.

18. The method of claim 17 wherein forming the dielectric solder barrier further comprises forming the dielectric solder barrier such that the dielectric solder barrier extends laterally on the surface of the second metallization layer around the periphery of the via such that the dielectric solder barrier is on only a portion of the second metallization layer opposite the second surface of the substrate.

19. The method of claim 17 wherein the dielectric solder barrier prevents solder from coming into contact with the portion of the second metallization layer within the via when the semiconductor die is attached to a mounting substrate.

20. The semiconductor die of claim 17 wherein the dielectric solder barrier comprises one or more layers selected from a group consisting of: an Aluminum Oxide layer, a Silicon Dioxide layer, a Hafnium Oxide layer, and a Titanium Oxide layer.

21. The method of claim 20 wherein forming the dielectric solder barrier comprises depositing the one or more layers using at least one of a group consisting of: a Plasma Enhanced Chemical Vapor Deposition process and an Atomic Layer Deposition process.

22. The method of claim 17 wherein the dielectric solder barrier is non-wetting with respect to Tin.

* * * * *